(12) United States Patent
Dow

(10) Patent No.: US 6,950,891 B1
(45) Date of Patent: Sep. 27, 2005

(54) SIGNAL ROUTING BETWEEN A MEMORY CONTROL UNIT AND A MEMORY DEVICE

(75) Inventor: Keith Dow, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 437 days.

(21) Appl. No.: 09/461,643

(22) Filed: Dec. 14, 1999

(51) Int. Cl.[7] .......................... G06F 13/00; H05K 1/14; H01R 12/16
(52) U.S. Cl. ..................... 710/100; 361/736; 361/785; 326/101
(58) Field of Search ................ 361/760, 777, 361/785, 794, 772; 365/51; 174/260, 261; 257/666; 710/305; 716/8, 15; 333/246

(56) References Cited

U.S. PATENT DOCUMENTS

| 4,904,968 | A | * | 2/1990 | Theus | 333/246 |
|---|---|---|---|---|---|
| 5,012,390 | A | * | 4/1991 | Erbele | 361/785 |
| 5,447,871 | A | | 9/1995 | Goldstein | |
| 6,005,776 | A | * | 12/1999 | Holman et al. | 361/760 |
| 6,061,263 | A | * | 5/2000 | Boaz et al. | 365/51 |
| 6,072,699 | A | * | 6/2000 | Horine | 361/777 |
| 6,111,205 | A | * | 8/2000 | Leddige et al. | 174/260 |
| 6,114,751 | A | * | 9/2000 | Kumakura et al. | 257/666 |
| 6,160,716 | A | * | 12/2000 | Perino et al. | 361/785 |
| 2002/0038405 | A1 | * | 3/2002 | Leddige et al. | 711/115 |

* cited by examiner

Primary Examiner—Glenn A. Auve
Assistant Examiner—Christopher E. Lee
(74) Attorney, Agent, or Firm—Fish & Richardson P.C.

(57) ABSTRACT

A computer system includes a processor and a multi-layer circuit board having a memory unit, a memory control unit, and a data bus coupling the memory control unit to the memory unit. A first signal line is formed on a selected layer of the circuit board and connected between a first pin on the memory unit and the memory control unit. A second signal line is also formed on the selected layer of the circuit board and is connected to the first pin on the memory unit.

19 Claims, 3 Drawing Sheets

SIGNAL ROUTING BETWEEN A MEMORY CONTROL UNIT AND A MEMORY DEVICE

TECHNICAL FIELD

The invention relates to signal routing between a memory control unit and a memory extender, such as a memory repeater hub device.

BACKGROUND

FIG. 1 shows a typical computer system 100. The computer 100 includes a central processing unit (CPU) 105, or processor, and a memory repeater hub 110 ("memory unit" 110). A memory control unit (MCU) 120 controls the flow of data into and out of the memory unit 110. The memory unit 110 always includes volatile memory, such as dynamic random access memory (DRAM). The computer also includes other system components, including a non-volatile storage device, such as a hard disk 125, and a modem 130 to connect the computer 100 to a network 135. A bus 115 connects the components 105, 120, 125 and 130 of computer 100, allowing data and/or commands to be transferred between the components.

The speed at which the computer operates depends in large part on the speed at which data is transferred between the processor 105 and the memory unit 110. One memory architecture in particular, known as the RAMBUS™ architecture, is designed to transfer data to the processor 105 at very high rates, e.g., 1.6 GB/s for a typical RAMBUS™ DRAM (RDRAM) module.

FIG. 2 shows a common routing configuration for signal lines connecting the MCU 120 to the memory unit. Each signal line 150 leaves the MCU 120 with a width of approximately 18 mils. Before reaching the appropriate pin 155 on the memory unit, the signal line 150 narrows, or "necks down", to a width of approximately 5 mils. The signal line 160 exiting the pin 155 also has a width of approximately 5 mils before expanding to a width of approximately 18 mils. A ground trade 165 separates the 5 mil neck down portions of the signal lines 150, 160. As a result of this congestion, the signal line 150 into the memory unit and the signal line 160 out of the memory unit often must be formed on different layers of the circuit board on which the MCU and memory unit reside.

SUMMARY

A computer system includes a processor and a multi-layer circuit board having a memory unit, a memory control unit, and a data bus coupling the memory control unit to the memory unit. A first signal line is formed on a selected layer of the circuit board and connected between a first pin on the memory repeater hub and the memory control unit. A second signal line is also formed on the selected layer of the circuit board and is connected to the first pin on the memory unit.

Other embodiments and advantages will become apparent from the description and claims that follow.

DETAILED DESCRIPTION

Figure 1:
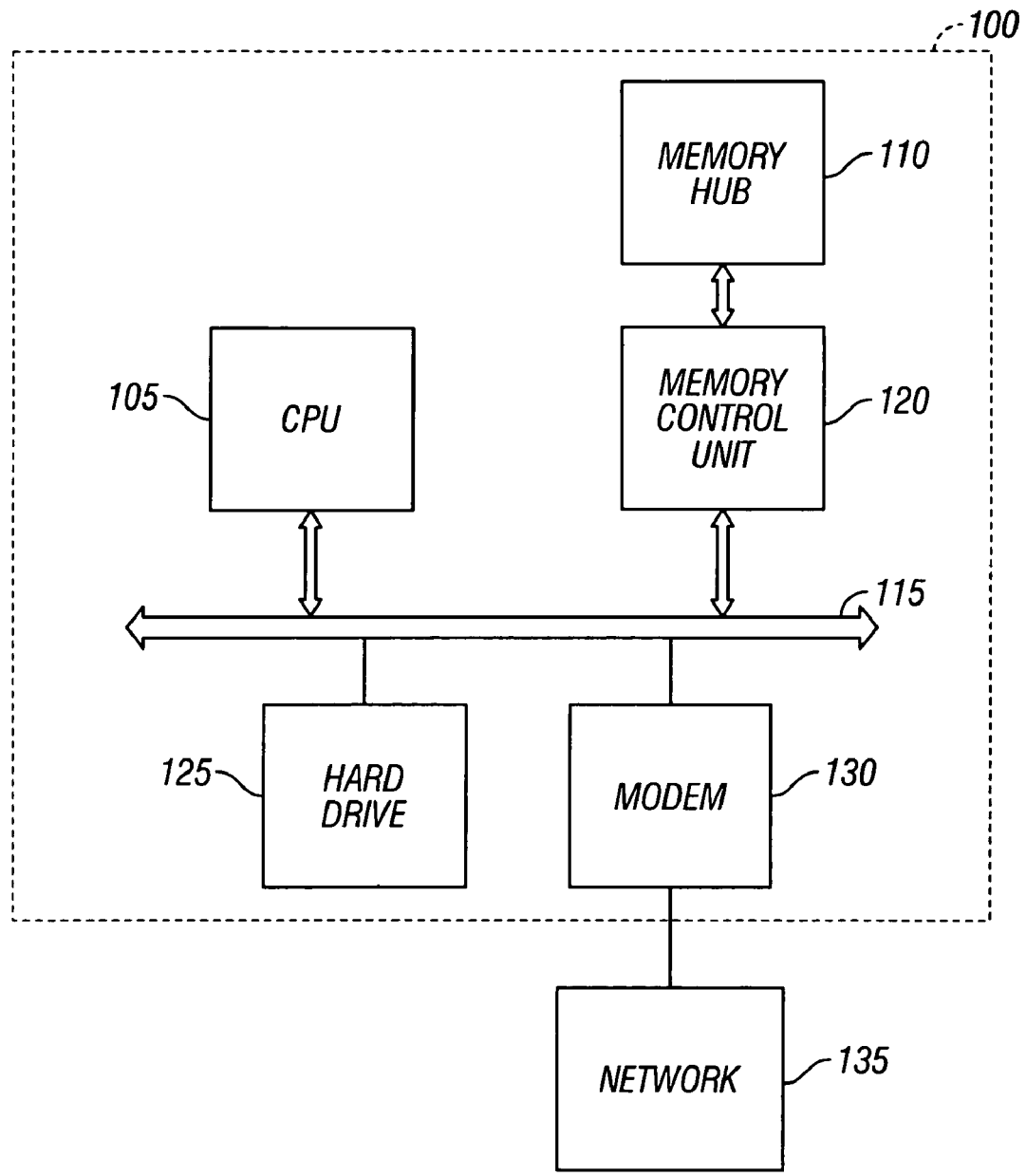
FIG. 1 is a block diagram of a computer system.
Figure 2:
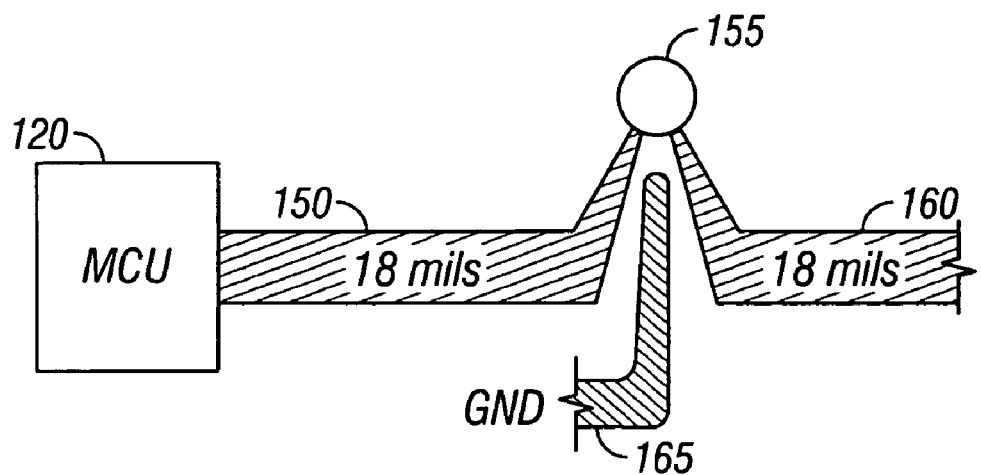
FIG. 2 is a schematic diagram of a conventional signal routing scheme.
Figure 3:
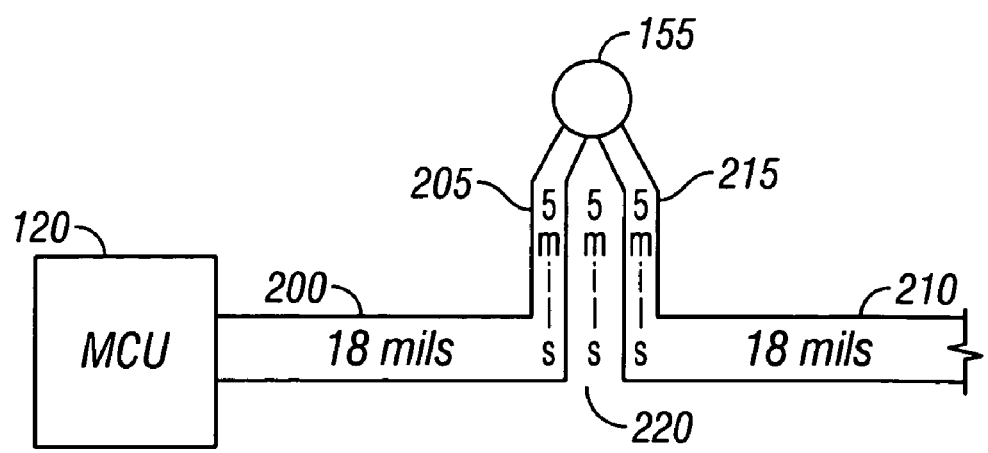
FIG. 3 is a schematic diagram of an improved signal routing scheme.

FIG. 3 shows a signal routing configuration that reduces the area required for each signal line 200 running between the MCU 120 and the memory unit. In this configuration, the signal line 200 has a width of approximately 18 mils with a 5 mil neck down portion 205 contacting the corresponding pin 155 on the memory unit. The signal line 210 exiting the pin 155 also has a width of approximately 18 mils with a 5 mil neck down portion 215 contacting the pin 155. The two neck down portions 205, 215 run substantially parallel to each other for a distance, and then at an acute angle for another distance, the portions are separated by a gap 220. This gap 220 also has a width of approximately 5 mils. The neck down portions 205, 215 are not separated by a ground trace.

The gap 220 between the neck down portions 205, 215 provides the isolation between the signal lines 200, 210 yet reduces the area required to route the signal lines on a circuit board. Placing the gap 220, and not a ground trace, between the neck down portions 205, 215 can reduce congestion at the memory unit. This allows the signal lines 200, 210 into and out of the memory unit to be routed on a single layer of the circuit board on which the MCU and the memory unit reside. Routing the signal lines in this manner reduces the number of layers required to route signals between the MCU and the memory unit by a factor of two. As a result, the circuit board on which the MCU and memory unit reside can be less expensive to produce than conventional memory boards.

Figure 4:
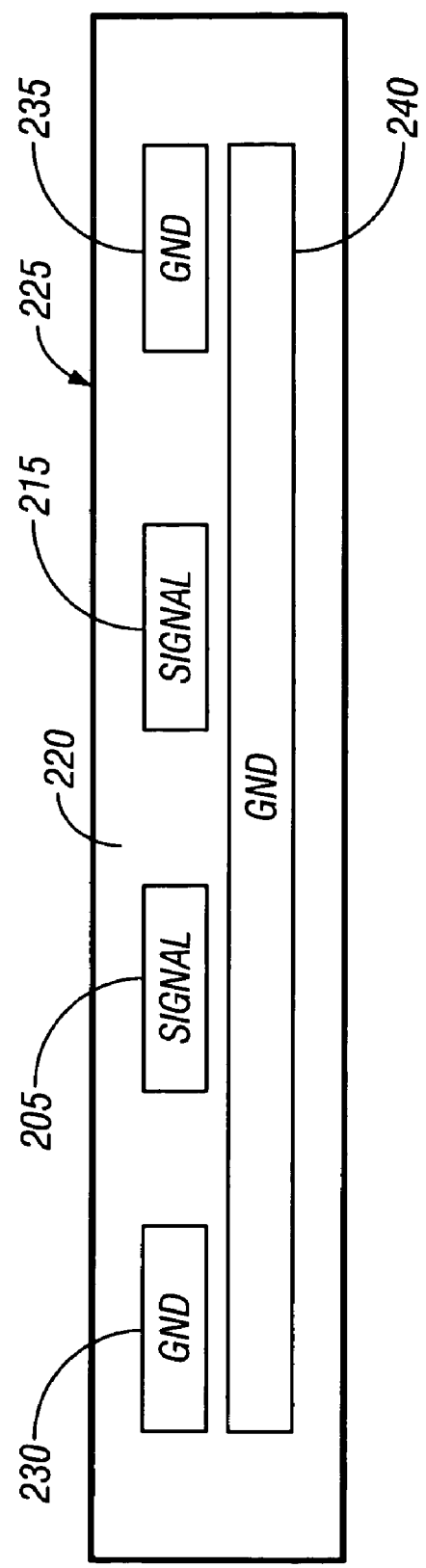
FIG. 4 is a cross-sectional view of a multi-layer circuit board having signal lines routed according to the scheme of FIG. 3.

FIG. 4 shows the neck down portions 205, of the signal line 200, and neck down portion 215 of signal line 210, on a multi-layer circuit board 225. The neck down portions 205, 215 into and out of the memory unit are formed on a single layer of the circuit board 225 and are separated by a gap 220 in which no traces are formed. No ground trace lies between the neck down portions 205, 215. In some embodiments, ground traces 230, 235 lie on either side of the neck down portions 205, 215 on the same layer of the circuit board 225. A ground plane 240 may lie above or below the signal lines 200, 210 on another layer of the circuit board.

A number of embodiments have been described. Nevertheless, one of ordinary skill will understand that variations are possible. For example, while the invention has been described in terms of signal routing to a RAMBUS™ device, this scheme is useful in routing signals to other types of memory devices and even to other system components. Accordingly, other embodiments are within the scope of the following claims.

What is claimed is:

1. A computer system comprising:
    a processor;
    a memory unit configured to store data used by the processor;
    a memory control unit configured to manage data flowing into and out of the memory unit; and
    a circuit board comprising:
        at least two layers formed in parallel to a surface of said circuit board,
        a first signal line, formed on a first layer of the circuit board and connected between a first pin on the memory unit and the memory control unit, and a second signal line also formed on the first layer of the circuit board and connected to the first pin on the memory unit, a first portion of the second signal line at an acute angle relative to a first portion of the first signal line, a second portion of the second signal line substantially parallel to a second portion of the first signal line, wherein said first layer defines a non-grounded gap between said first and second portions of the first and second lines.

2. The system of claim 1, further comprising third and fourth signal lines, on a second layer of the circuit board, different than the first layer.

3. The system of claim 1, wherein the second portion of the first signal line and the second portion of the second signal line have substantially equal widths.

4. The system of claim 3, wherein the second portion of the first signal line and the second portion of the second signal line are separated by a perpendicular distance substantially equal to said widths.

5. The system of claim 4, wherein the widths of the lines and the perpendicular distance separating the second portions of the lines are each substantially equal to 5 mils.

6. The system of claim 1, wherein the memory unit comprises a RAMBUS™ device.

7. The computer system of claim 1, wherein the memory unit comprises a memory repeater hub.

8. A method for use in routing signals between a memory unit and a memory control unit, the method comprising:
delivering a first signal over a first signal line on a first layer formed in parallel to a second layer on a surface of a multi-layer circuit board and connected between the memory control unit and a first pin on the memory unit;
delivering a second signal over a second signal line formed on the first layer of the circuit board and connected to the first pin of the memory unit, a first portion of the second signal line formed at an acute angle relative to a first portion of the first signal line, a second portion of the second signal line formed substantially parallel to a second portion of the first signal line,
said first and second portions of the first and second signal lines separated without a ground connection therebetween.

9. The method of claim 8, further comprising delivering another signal to said memory control unit on another parallel layer of the circuit board over portions of the first and second signal lines that are not separated by any conductive traces.

10. The method of claim 8, wherein delivering the first signal and the second signal includes delivering the signals over second portions of the first and second signal lines that have substantially equal widths.

11. The method of claim 10, wherein delivering the first signal and the second signal includes delivering the signals over second portions of the first and second signal lines that are separated by a perpendicular distance substantially equal to their widths.

12. The method of claim 11, wherein delivering the first signal and the second signal includes delivering the signals over second portions of the first and second signal lines that are substantially equal to 5 mils wide and that are separated by a perpendicular distance substantially equal to 5 mils.

13. A method for use in manufacturing a computer system, the method comprising:
forming at least two layers parallel to a surface of a circuit board, with first and second signal lines on a first layer of the board;
connecting a memory unit to the board such that a first pin on the memory unit connects to the first and second signal lines;
affixing a memory control unit to the board such that the memory control unit connects to at least the first signal line;
forming a first portion of the second signal line to be at an acute angle relative to a first portion of the first signal line; and
forming a second portion of the second signal line to be substantially parallel to a second portion of the first signal line.

14. The method of claim 13, further comprising forming the first and second signal lines such that no conductive trace lies between the second portion of the first signal line and the second portion of the second signal line.

15. The method of claim 14, further comprising forming the second portion of the first signal line and the second portion of the second signal line to have substantially equal widths.

16. The method of claim 15, further comprising forming the second portion of the first signal line and the second portion of the second signal line to be separated by a perpendicular distance approximately equal to their widths.

17. The method of claim 16, further comprising forming the signal lines such that the widths of the lines and the perpendicular distance separating the second portions of the lines are all substantially equal to 5 mils.

18. A circuit board comprising at least two layers formed in parallel to a surface of said circuit board for use in a computer system comprising:
a memory unit;
a memory control unit; and
a data bus connecting the memory control unit to the memory unit and comprising:
a first signal line formed on a first layer of the circuit board and connected to the memory control unit and to a first pin on the memory unit, and
a second signal line formed on the first layer of the circuit board and also connected to the first pin connection on the memory unit, a first portion of the second signal line at an acute angle relative to a first portion of the first signal line, a second portion of the second signal line substantially parallel to a second portion of the first signal line,
wherein the widths of the lines and a perpendicular distance separating the second portions of the lines are each substantially equal, and
wherein said first layer defines a non-grounded gap between said first and second portions of the first and second lines.

19. The circuit board of claim 18, wherein the memory unit comprises a memory repeater hub.

* * * * *